Nov. 17, 1970 W. O. LUETZE 3,541,350

SIMULATED DIODE CIRCUIT

Filed June 28, 1968 2 Sheets-Sheet 1

INVENTOR
WILHELM O. LUETZE

BY Kenneth R. Stevens

ATTORNEY

United States Patent Office 3,541,350
Patented Nov. 17, 1970

3,541,350
SIMULATED DIODE CIRCUIT

Wilhelm Otto Luetze, Baden-Wurttemberg, Germany, assignor to International Business Machines Corporation, Armonk, N.Y., a corporation of New York Filed June 28, 1968, Ser. No. 740,909
Int. Cl. G06g 7/12
U.S. Cl. 307—229 5 Claims

ABSTRACT OF THE DISCLOSURE

A simulated diode circuit comprising first and second semiconductor devices having their respective base terminals interconnected. An emitter of the first semiconductor device, and an emitter of the second semiconductor device constitute cathode and anode terminals, respectively, of the simulated diode circuit. The second semiconductor device is connected to a reference potential so as to be maintained in a conductive state. A predetermined relative voltage differential between the anode and cathode terminals determines the conductive state of the first semiconductor device, and in turn the state of the simulated diode circuit.

BACKGROUND OF THE INVENTION

Present day semiconductor devices show a relatively high voltage drop in the forward direction. With semiconductor diodes of germanium a forward voltage drop of more than 0.1 volt is encountered. Silicon diodes are frequently employed instead of germanium diodes by virtue of their higher admissible ambient temperature and inverse voltage operating ranges. Silicon diodes exhibit an even higher voltage drop in the forward direction and may reach a range of higher than 0.5 volt. Semiconductor diodes of gallium arsenide and other semiconductor materials possess a forward voltage drop of even a greater amount. This voltage drop in the forward direction is a disadvantage in many fields of application. In addition thereto, the forward voltage drop is strongly dependent on temperature, which equally represents an additional undesirable feature. Finally, the current-voltage characteristic of the standard semiconductor diodes are determined by physical laws, and therefore their operating characteristics can only be influenced in a conditional manner, that is, the differential internal resistance of the semiconductor devices in a forward direction is controllable in only limited situations and degrees.

In order to eliminate the disadvantages attendant with semiconductor diodes, the present invention provides a simulated diode circuit having improved characteristics, and which characteristics are controllable to a great extent.

It is an object of this invention to reduce the forward voltage drop characteristic inherent in semiconductor diodes.

Another object of the present invention is to reduce the forward voltage drop inherent in semiconductor diodes while maintaining stability against temperature and load variations.

SUMMARY OF THE INVENTION

The present invention relates to a simulated diode circuit having improved forward voltage characteristics and includes first and second semiconductor devices having their bases interconnected, and wherein an emitter terminal of the first device constitutes a cathode of the simulated diode, and an emitter terminal of the second device constitutes an anode of the simulated diode. A reference voltage potential is connected to the second devices so as to maintain it in a conductive state. The first device is switched to a conductive state in response to a predetermined relative voltage differential between the anode and the cathode to switch the simulated diode circuit from a high impedance to a low impedance level.

DESCRIPTION OF THE DRAWINGS

The foregoing and other objects, features and advantages of the invention will be apparent from the following more particular description of the preferred embodiment of the invention as illustrated in the accomapnying drawings of which.

DESCRIPTION OF PREFERRED EMBODIMENTS

Figure 1:
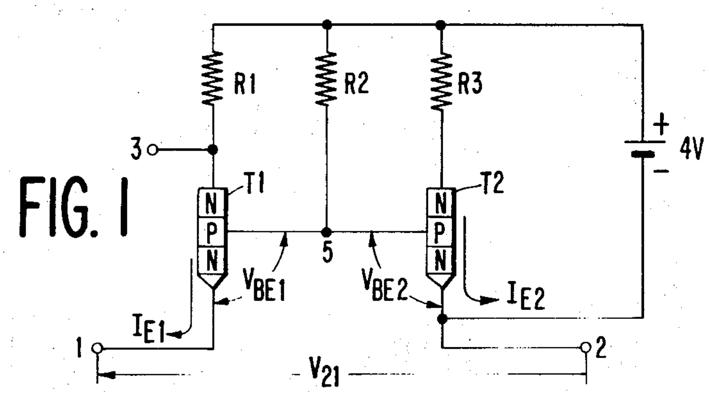
FIG. 1 is a schematic diagram illustrating one preferred embodiment of the present invention.

Description of FIGURE 1

Now deferring to FIGURE 1, a first embodiment of the simulated diode circuits as disclosed by the invention is shown, and which circuit has improved diode properties. This circuit contains two NPN transistors T1 and T2 whose base electrodes are connected with each other. The collectors of transistors T1 and T2 are connected via their collector resistors R1 and R3 with a positive terminal of a reference potential or source of current 4, to which is also connected one end of the base resistor R2 common to both transistors T1 and T2. The emitter of transistor T1 is connected with a terminal 1 which corresponds to the cathode of a standard semiconductor diode, whereas the emitter of the transistor T2 is connected with the negative terminal of the current source 4 and a terminal 2 which corresponds to the anode of a standard diode.

Operation of FIGURE 1

When the potential of terminal 1 is more positive than that of terminal 2, the base-emitter voltage $V_{BE1}$ of transistor T1 is substantially lower than that of transistor T2. The circuit is thus in off-state. In this state, the end of base resistor R2, which is connected with the two base electrodes, is at a potential which is more positive, by approximately 0.8 volt, than terminal 2. When the potential of terminal 1 is lowered, the base-emitter voltage $V_{BE1}$ of transistor T1 rises and transistor T1 begins to be conductive. A continuously increasing part of the quasi-constant current from the source 4 is fed in via the base resistance R2, and flows into the base emitter diode of transistor T1, until both transistors finally carry approximately the same emitter currents. The circuit is now in forward-direction or low impedance state.

Figure 3:
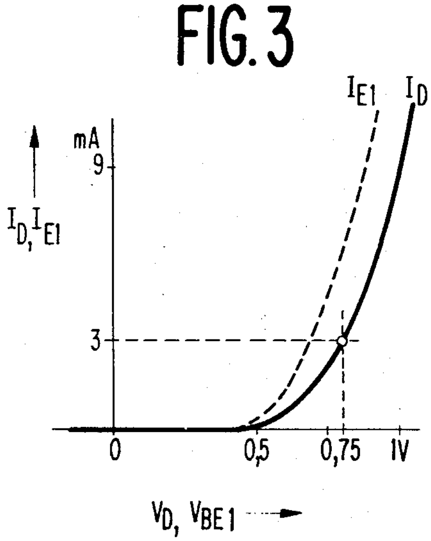
FIG. 3 shows a current-voltage characteristic curve of a prior art semiconductor diode which is formed by employing the base-emitter zone of a transistor, and a curve representing the current versus base-to-emitter voltage for the same transistor.
Figure 4:
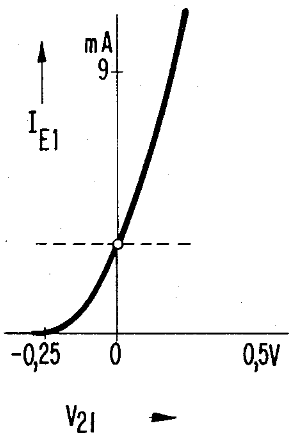
FIG. 4 is a curve illustrating the improved current-voltage characteristic of the simulated diode circuit shown in FIG. 1.

An advantage of the circuit as shown by FIGURE 1, compared with a standard diode having the same properties as the base emitter diode of transistor T1, is the resulting reduced forward direction voltage, as shown from a comparison of the current-voltage, $I_D$–$V_D$, characteristic of the standard diode, FIGURE 3, with the current-voltage characteristic of the circuit of FIGURE 1, as shown by FIGURE 4.

A comparison of the steepness of the two characteristics curves for the same current values, e.g. for 3 ma., shows that a higher steepness of the characteristic curve exists for the circuit as disclosed by FIGURE 1, which corresponds to a decreased differential internal resistance of this circuit as compared with that of the standard diode. By virtue of the emitter current $I_{E1}$, which starts to flow when transistor T1 becomes conductive, the differential internal resistance of the circuit of FIGURE 1, measured between terminals 1 and 2, decreases, as compared with the internal resistance of a standard diode having the properties of the base-emitter zone of transistor T1, by a value which is approximately the current amplification factor $\beta$ of transistor T1, at the same base current.

The current-voltage characteristic shown in FIGURE 4 of the circuit of FIGURE 1 shows the relationship between the current flowing through terminals 1 and 2 corresponding to the cathode and anode of a conventional diode, and the voltage $V_{21}$ existing between these terminals. The current flowing through terminals 1 and 2 is the emitter current $I_{E1}$ of transistor T1. In FIGURE 3 it is shown as a dash line as a function of the base emitter voltage $V_{BE1}$. The voltage $V_{21}$ between terminals 2 and 1 is generated, according to Kirchhoff's second law $\Sigma V=0$, as a difference of the two base emitter voltages $V_{BE1}-V_{BE2}$. Consequently, the current-voltage characteristic for the circuit of FIGURE 1 is obtained by subtracting from the base emitter voltage $V_{BE1}$, belonging to a predetermined current value of the emitter current $I_{E1}$ and shown by the dash line of the current-voltage characteristic of FIGURE 3, the base emitter voltage $V_{BE2}$ which then occurs at transistor T2, and by applying the associated current value $I_{E1}$ over this voltage difference.

In the diode simulated circuit of FIGURE 1, transistor T2 carries, in forward-direction status, an emitter current $I_{E2}$ which is of approximately the same value as the emitter current $I_{E1}$ supplied by transistor T1 into the external circuit between terminals 1 and 2. Accordingly, proper selection of circuit parameters provides that at a particular emitter current $I_{E1}$, the voltage $V_{21}$ is practically at zero volts, as further illustrated in FIGURE 3 and 4.

Another advantage of the circuit as shown by FIGURE 1 consists in the fact that only a fraction of the current supplied to an external circuit (not shown) connected to terminals 1 and 2 flows via resistor R2. Due to this fact, fluctuations or variations in the current which flows through the external circuit have only a negligible effect. The variations are reduced by a value which is approximately the reciprocal value of the current amplification factor $\beta$ of the base current of transistor T1. With quasi-constant current flowing via resistance R2, the fluctuations of the base current for transistor T1 cause relatively opposite or counter-sense fluctuations in the base current of transistor T2. Thus, the potential of the point or node 5 changes only in accordance with the fluctuations in the base current being supplied. The potential of point 5, however, should fluctuate or vary as little as possible, since otherwise the point of reference for the base-emitter voltage of transistor T1 and consequently the emitter potential, i.e. the input potential, would shift.

Figure 2:
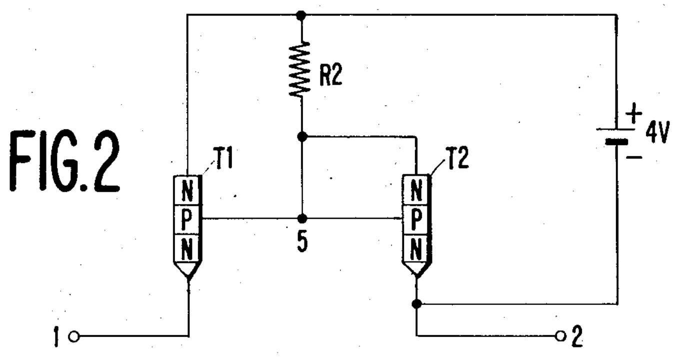
FIG. 2 is a schematic diagram of a second embodiment of the present invention.

Description of FIG. 2

A further improved circuit as compared with the circuit of FIG. 1 is shown in FIG. 2. The circuit of FIG. 2 differs from that of FIG. 1 in that the collector of transistor T1 is directly connected with the positive terminal of the operation current source 4. The collector of transistor T2 is now connected with the lower end of the base resistor R2.

Also, the circuit of FIG. 2 has better high frequency conditions than the circuit of FIG. 1 due to the negative feedback from the collector of transistor T2 to the base of transistor T2, so as to prevent T2 from operating in the saturation area.

Operation of FIG. 2

Furthermore, variations in the potential at the point of connection 5 with the base electrodes and the resistor R2, and consequently fluctuations of the base-emitter voltage $V_{BE2}$ of transistor 2, are suppressed or compensated in the circuit of FIG. 2 due to fluctuations of the current flowing into the external circuit (not shown) on account of the negative feedback connection. The quasi-constant current flowing through resistor R2 flows mainly (approximately 98%) into the collector of transistor T2. The remainder of the current flowing through resistance R2 flows into the bases of transistors T1 and T2. If by virtue of a rise in the current demanded by an external circuit connected between terminals 1 and 2, the base of transistor T1 will require more base current and thus the base of transistor T2 receives reduced base current. The potential of point 5 is slightly lowered, and consequently transistor T2 is less conductive, which in turn causes the collector current of T2 to decrease to a small degree. This, however, causes the quasi-constant current which remains for the bases of T1 and T2 to rise. Thus, the base current for transistor T2 increases and the potential of point 5 practically returns to its previous value. The rise of the base current of transistor T1, caused indirectly by a demand from an external load, has been compensated therefor after the expiration of the transient time in the regulation process by means of a corresponding reduction of the collector current of transistor T2.

Figure 5:
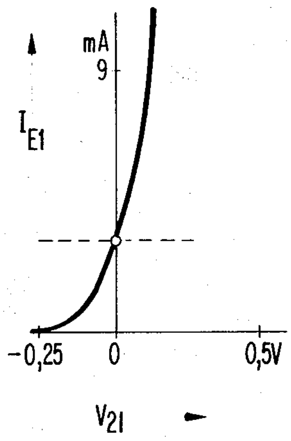
FIG. 5 is a curve illustrating the improved current-voltage characteristic of the simulated diode circuit as shown in FIG. 2.

The stabilization of the potential of the circuit of FIG. 2 at the node 5 is caused by the negative feedback and favorably reduces the differential internal resistance of the over-all circuit. The reduced differential internal resistance of the circuit, as disclosed in FIG. 2, is represented in the sharper steepness in the associated current-voltage characteristic curve of FIG. 5. If this characteristic is compared with the characteristic shown in FIG. 4 for the circuit of FIG. 1, the increase in curve steepness is evident. Compared with the diode characteristic shown in FIG. 3, the steepness of the characteristic as disclosed by FIG. 5 is better by approximately a factor 3, which corresponds to a differential internal resistance reduced by one-third compared with that of a diode with a characteristic as shown by FIG. 3.

Figure 6:
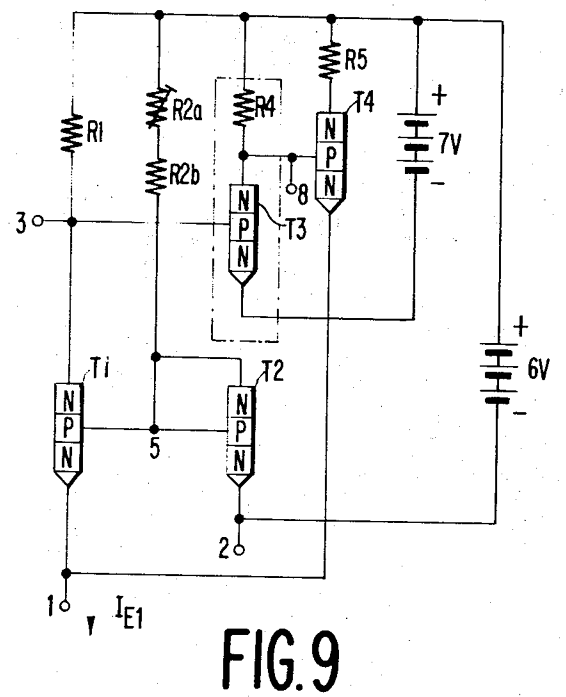
FIG. 6 is a schematic diagram of another simulated diode circuit embodying the basic simulated diode circuit shown in FIG. 2.

Description of FIG. 6

Figure 8:
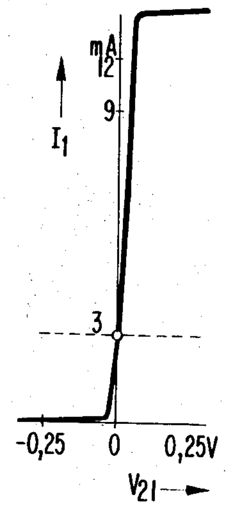
FIGURE 8 illustrates the improved current-voltage characteristic of the simulated diode circuit shown in FIGURE 6.

In FIG. 6 another simulated diode circuit embodying the basic concepts of the present invention is shown. The essential difference between this circuit with improved diode properties, as compared with the circuit of FIG. 2, is in the fact that it contains an additional amplifier means which further reduces the internal resistance of this circuit. If the amplification of the additional amplifier is sufficiently high, the internal resistance of the circuit can be considerably reduced at the expense of its cut-off frequency. Another difference between this circuit and the circuit of FIG. 2 exists in the fact that the collector of transistor 1 and the terminal 3 connected therewith are connected via the collector-resistor R1 to the positive terminal of a reference potential or source of current 6. Resistor R1 has a relatively high value to insure that in those cases where low collector currents of transistor T1 are involved there is a high voltage drop at the resistor R1, such that as little base current as possible flows via that resistor R1 into transistor T3. Furthermore, this insures that transistor T3 does not operate too much in the saturation zone, or otherwise the response time of this transistor stage T3 would be excessively long on account of the storage time due to minority carriers stored in its base. On the other hand, the value of the resistor should not be too high either, since if the base current for transistor T3 is too low its collector potential becomes too positive which would cause transistor T4 to become conductive too soon. The base resistor common to both transistors T1 and T2 consists in this circuit of a series arrangement of a fixed resistor $R_{2b}$ and an adjustable resistor $R_{2a}$ which sets the point of intersection of the current-voltage characteristic shown in FIG. 8 for the circuit of FIG. 6 with the current axis at predetermined limits.

The input of the additional amplifier containing transistors T3 and T4 is joined to the terminal 3 connected to the collector of transistor T1, while the output of the amplifier is connected with the terminal 1 joined to the emitter of transistor T1. Terminal 1 corresponds to the cathode of a conventional diode. The emitter of the transistor stage T3 is connecter with the negative terminal of a reference potential or source of current 7, and its collector is connected with a terminal 8 and the base of the transistor stage T4, as well as to a collector resistor R4, which in turn connects with a positive terminal on source 7. The collector of the amplifier stage T4 is connected via a collector resistor R5 with the positive terminal on the source 6, while the emitter is connected with the output terminal 1 of the circuit.

Operation of FIG. 6

In the backward-direction or high impedance state of the circuit, transistors T2 and T3 are conductive, while transistors T1 and T4 are cut off. In this state, the collector-emitter voltage $V_{CE_3}$ of transistor T3 is approximately 0.3 volt, whereas its base emitter voltage $V_{BE_3}$ amounts to approximately 0.75 volt. Consequently, transistor T3 operates in the saturation zone. With sources 6 and 7 at selected appropriate values, transistor T4 is cut off. As soon as the potential of terminal 1 becomes considerably more negative than that of node 5, transistor T1 becomes equally conductive, as already discussed in connection with the circuits of FIGS. 1 and 2. Both transistors T1 and T2 now carry approximately the same emitter currents. Due to the collector current flowing when transistor T1 becomes conductive, the base of transistor T3 loses part of the base current fed via resistor R1. Transistor T3 is less conductive when transistor T1 gets more conductive, so that the collector potential of T3 is rising. As soon as this collector potential of T3 is more positive by approximately 0.5–0.6 volt than the potential at point 1, the transistor T4 starts to be conductive.

The current flowing from terminal 1 after transistor T4 has become conductive is supplied almost entirely by the transistor T4. For this reason, an improved current-voltage characteristic, shown in FIG. 8, for the circuit shown in FIG. 6 is obtained. This result represents the current flowing again through terminals 1 and 2, assuming an external load, and depends on the voltage between these terminals. As can be seen, when transistor T4 becomes conductive, the curve is practically vertically extending and corresponds to an extremely low differential internal resistance in this circuit. The upper bend of the characteristic curve is due to the current limitation caused by resistor R5.

If a reference voltage source is inserted between terminal 2 and a ground potential (not shown), a circuit containing the diode simulation with characteristic of the circuit of FIG. 6 can be shifted to the left or right along the voltage axis. Corresponding principles of operation as to this fact of course apply to the characteristics of the circuits as shown in FIGS. 1 and 2.

Since the base emitter voltage of transistor stage T3 depends on temperature, the response point of the amplifier is slightly dependent on temperature too. To alleviate this problem, the circuit of FIG. 6 is modified in accordance with the circuit shown in FIG. 7.

Figure 7:
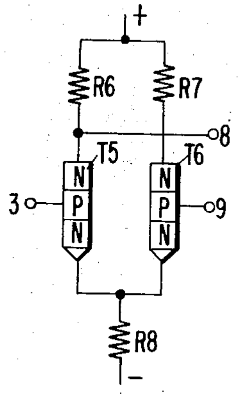
FIG. 7 is a schematic diagram illustrating an amplifying circuit which may be substituted in the simulated diode circuit of FIG. 6 in order to improve temperature stability.

Description of FIG. 7

For transistor T3 and its collector resistor R4 in FIG. 6, a circuit of FIG. 7 is substituted therefor. The circuit comprises two emitter-coupled transistors T5 and T6, and respective collector resistors R6 and R7 connected to positive terminal of the source 7. The lower end of an emitter resistor R8 is connected to the negative terminal of the source 7. Point or terminal 9 is connected with point 5, or with another suitable reference voltage source. Temperature dependence for the response point of the amplifier is thus eliminated by virtue of the back-to-back connection for the two base emitter diodes in the circuit of FIG. 7.

Operation of FIG. 7

In the cut-off state of the circuit, i.e as long as no current leaves terminal 1, transistors T1 and T4 are cut off, whereas transistors T2 and T5 are conductive and transistor T6 is weakly conductive. As soon as the potential at terminal 1 is sufficiently negative with respect to that of terminal 2, transistor T1 also becomes conductive. Transistors T1 and T2 then have approximately the same emitter currents. Due to the voltage drop at the collector of transistor T1 when it conducts, transistor T5 begins to turn off such that transistor T6 shares part of the current which before had been flowing through transistor T5, until both transistors T5 and T6 are conductive to the same degree. Due to the current reduction in transistor T5, its collector potential is rising, so that transistor T4 is conductive and thus supplies current to terminal 1.

Figure 9:
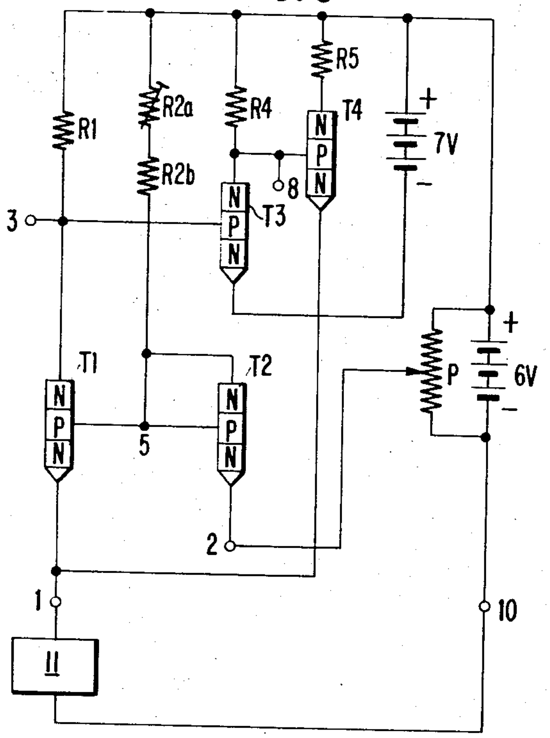
FIGURE 9 is a schematic diagram of a simulated diode circuit, and illustrates a modification to the simulated diode circuit shown in FIGURE 6.

Description of FIG. 9

In the circuits of FIGS. 1, 2, and 6, the current leaving terminal 1 flows back again via terminal 2 to the source 4 of the dioxide simulation circuit after having passed through an external circuit or load 11. This exerts a load on a reference voltage source inserted between terminal 2 and the ground potential (not shown). The load on the reference voltage source (not shown) is eliminated by the modifications shown in FIG. 9. Here, the reference voltage is tapped by a voltage divider P arranged in parallel to the source 6. The tap is connected with terminal 2. As can be seen from FIG. 9, the current leaving terminal 1, after having passed through the external circuit or load 11, flows back into the operation current source at terminal 10 and does not exert a load on the reference voltage source (not shown).

In actual practice the reference voltage which is supplied to terminal 2 of the circuits can be conveniently selected. It can therefore also be the output voltage of a regulation amplifier. It is thereby possible to ensure that the passing of the diode simulation from cut-off into the forward direction status and vice versa follows a predetermined regulation function, e.g., in order to meet the temperature dependence of other components or circuits, or the voltage sensitivity thereof.

The low temperature dependence which is a feature of all circuits described is mainly due to the back-to-back connection of the base emitter diodes of transistors T1 and T2. If these two transistors are built by monolithic technique by means of a common diffusion process with suitable selected circuit values, substantially identical emitter currents for both transistors T1 and T2 are caused to flow in the forward state. As a result an almost perfect temperature compensation is obtained as well as very low production variation in the nominal voltage in forward direction. Under these limitations, the adjusting resistor R2*a* provided in the circuit of FIG. 6 is no longer required for the plurality of applications.

Figure 10:
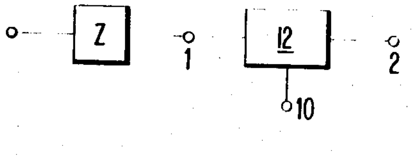
FIGURES 10 and 11 schematically illustrate a manner in which a simulated diode circuit of the present invention is interconnected to an external network in order to obtain desired internal matching of resistances.
Figure 11:
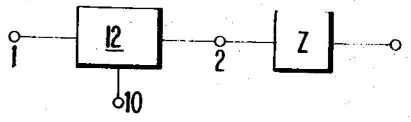

Description of FIGS. 10 and 11

As a general rule it can be pointed out that, as indicated in FIGS. 10 and 11, a passive two-terminal network, Z, e.g., a resistor, or an active two-terminal network Z is arranged before or after terminals 1 or 2, in order to achieve the internal resistance matching for the entire circuit. It is equally possible to install the diode simulation circuit of the present invention in a four-terminal network. Element 12 represents a simulated diode circuit of course.

Of the many possible uses of the diode simulation as disclosed by the present invention, special mention should be made of the use in very precise limit switches, in differential amplifiers, in electronic safety devices, and in regulator amplifiers.

Any specific value of circuit parameters or voltages are given for purposes of illustration and in no way are intended to limit the broad concept described in the present invention.

While the invention has been particularly shown and described with reference to preferred embodiments thereof, it will be understood by those skilled in the art that various changes in form and details may be made therein without departing from the spirit and scope of the invention.

What is claimed is:

1. A simulated diode having improved forward voltage characteristics comprising:

(a) a first and a second semiconductor device each having base, collector, and emitter terminals,
(b) said base terminals being interconnected,
(c) said emitter terminal of said first device constituting the cathode of the simulated diode, and said emitter terminal of said second device constituting an anode of the simulated diode,
(d) a reference potential means,
(e) said second semiconductor device being connected to said reference potential so as to be maintained in a conductive state, and
(f) said first semiconductor device being connected to said reference potential so as to be switched to a conductive state in response to a predetermined relative voltage differential between the anode and the cathode of the simulated diode.

2. A simulated diode having improved forward voltage characteristics as in claim 1 further including:

(a) a third semiconductor amplifying means having an input and an output,
(b) another source of reference potential connected to said third semiconductor amplifying means,
(c) said third semiconductor amplifying means having its output connected to the cathode of the simulated diode and its input connected and responsive to said first semiconductor amplifying device for delivering current to the cathode when said first amplifying device is in a conductive state.

3. A simulated diode having improved forward voltage characteristics comprising:

(a) a first and a second semiconductor device, each having base, collector, and emitter terminals,
(b) said emitter terminal of said first device constituting the cathode of the simulated diode, and said emitter terminal of said second device constituting an anode of the simulated diode,
(c) a reference potential means,
(d) said base terminals of said first and second device being interconnected to form a node,
(e) a resistance means connected between said node and said reference potential,
(f) said second device being connected to said reference potential so as to be maintained in a conductive state, and
(g) said first device being connected to said reference potential so as to be switched to a conductive state in response to a predetermined relative voltage differential between the anode and the cathode of the simulated diode.

4. A simulated diode having improved forward voltage characteristics as in claim 3 further including:

(a) a connection means between said collector of said second semiconductor device and said node for providing negative feedback to said node in order to maintain a relatively constant reference potential at said node despite an increased current flow in an external load placed between the anode and cathode of the simulated diode circuit.

5. A simulated diode circuit having improved forward voltage characteristics as in claim 4 further including:

(a) a second source of reference potential,
(b) semiconductor amplifying means connected to said second source of reference potential and having an input and output terminal,
(c) said input terminal of said amplifying means connected to said collector of said first semiconductor device, and said output terminal of said amplifying means connected to said emitter of said first semiconductor device, and
(d) said semiconductor amplifying means responsive to said first semiconductor device being switched to a conductive state for supplying an output current to said emitter terminal of said first semiconductor device.

References Cited

UNITED STATES PATENTS

| | | | |
|---|---|---|---|
| 2,891,171 | 6/1959 | Shockley | 307—299 X |
| 3,320,551 | 5/1967 | Miller | 307—237 X |

DONALD D. FORRER, Primary Examiner
R. C. WOODBRIDGE, Assistant Examiner

U.S. Cl. X.R.

307—200, 299, 317; 328—142